United States Patent
Li et al.

(10) Patent No.: US 10,483,289 B2
(45) Date of Patent: Nov. 19, 2019

(54) ARRAY SUBSTRATE AND MANUFACTURING METHOD THEREOF AND DISPLAY DEVICE

(71) Applicant: Shenzhen China Star Optoelectronics Semiconductor Display Technology Co., Ltd., Shenzhen, Guangdong (CN)

(72) Inventors: Wenying Li, Guangdong (CN); Xiaodi Liu, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 14 days.

(21) Appl. No.: 15/764,974

(22) PCT Filed: Jan. 4, 2018

(86) PCT No.: PCT/CN2018/071303
§ 371 (c)(1),
(2) Date: Mar. 30, 2018

(87) PCT Pub. No.: WO2018/233276
PCT Pub. Date: Dec. 27, 2018

(65) Prior Publication Data
US 2019/0043891 A1     Feb. 7, 2019

(51) Int. Cl.
*H01L 27/12* (2006.01)
*H01L 23/36* (2006.01)
*H01L 23/34* (2006.01)

(52) U.S. Cl.
CPC ............ *H01L 27/124* (2013.01); *H01L 23/34* (2013.01); *H01L 23/36* (2013.01); *H01L 27/1214* (2013.01); *H01L 27/1285* (2013.01)

(58) Field of Classification Search
CPC ................ H01L 27/12; H01L 33/64; H01L 27/1214–1296; H01L 23/34–4735; H01L 27/124
See application file for complete search history.

(56) References Cited

U.S. PATENT DOCUMENTS

2014/0145164 A1*  5/2014  Odaka ............... H01L 27/3276
                                                                       257/40
2015/0279690 A1    10/2015  Ryu et al.
(Continued)

FOREIGN PATENT DOCUMENTS

CN        202473923 U    10/2012
CN        104282769 A     1/2015

*Primary Examiner* — William F Kraig
*Assistant Examiner* — Khatib A Rahman
(74) *Attorney, Agent, or Firm* — Andrew C. Cheng

(57) ABSTRACT

An array substrate includes a carrier plate, a first heat dissipation layer, and a function layer sequentially stacked on each other. The function layer is arranged on one side facing a user. The function layer includes a plurality of drive devices, metal wires and connection sections arranged between the plurality of drive devices. The plurality of drive devices are formed with openings. The connection sections each have an end extending through the openings to connect with one of the drive devices and an opposite end extending across the metal wires to connect with an adjacent one of the drive devices. The first heat dissipation layer conducts heat from the metal wires, the plurality of drive devices, and the connection sections through the carrier plate for dissipation. A method for manufacturing the array substrate and a display device are also provided.

11 Claims, 6 Drawing Sheets

(56) References Cited

U.S. PATENT DOCUMENTS

2017/0110488 A1\* 4/2017 Sun .................... H01L 27/1274
2018/0090601 A1\* 3/2018 Yan ....................... C23C 14/185

\* cited by examiner

ARRAY SUBSTRATE AND MANUFACTURING METHOD THEREOF AND DISPLAY DEVICE

CROSS REFERENCE TO RELATED APPLICATIONS

This application claims the priority of Chinese Patent Application No. 201710488943.7 filed on Jun. 23, 2017, titled "Array Substrate and Manufacturing Method Thereof and Display Device", the disclosure of which is incorporated herein by reference in its entirety.

BACKGROUND OF THE INVENTION

1. Field of the Invention

The present invention relates to the field of electronic equipment, and more particularly to an array substrate and a manufacturing method thereof, and a display device.

2. The Related Arts

With the consumers' increasing demands for finer and finer resolution of display devices and increasing expansion of sizes of the display devices, as well as exacted pursuit for visual effects achievable with ultra slim bezels, metal wirings of the display devices are subjected to increasingly denser arrangements. For example, to have an increased resolution of a display device, an increased number of thin-film transistors (TFTs) must be provided in an array substrate and consequently, a denser arrangement of metal wirings in the array substrate is needed. However, such metal wirings and the TFTs generate joule heating when electrical currents flow therethrough, and thus, temperatures of components in the array substrate increase, leading to deterioration of the properties of the components. Particularly, the heating issues are even more seriously at sites where the metal wirings are connected with vias and this may cause burn-out of the vias, and eventually leads to disconnection.

SUMMARY OF THE INVENTION

In view of the above problem, an object of this application is to provide an array substrate and a manufacturing method thereof and a display device that improve heat dissipation performance of the array substrate.

In order to overcome the deficiencies existing in the background art, this application provides an array substrate, which comprises a carrier plate, a first heat dissipation layer, and a function layer arranged to stack in sequence on each other, the function layer being arranged on one side adapted to face a user, wherein the function layer comprises a plurality of drive devices and metal wires and connection sections arranged between the plurality of drive devices, the plurality of drive devices being formed therein with openings, the connection sections each having an end extending through the openings to connect to one of the drive devices and an opposite end extending across the metal wires to connect to an adjacent one of the drive devices, the first heat dissipation layer dissipating heat from the metal wires, the plurality of drive devices, and the connection sections through the carrier plate.

In the above, a second heat dissipation layer is further included, wherein the second heat dissipation layer is stacked on the carrier plate and is located on one side of the carrier plate that is opposite to the function layer.

In the above, the function layer comprises drive device zones, metal wire zones, and connection section zones, the drive device zones comprising the drive devices arranged therein, the metal wire zones comprising the metal wires arranged therein, the connection section zones comprising the connection sections arranged therein, the first heat dissipation layer having an orthogonal projection on the function layer that falls within the metal wire zones, the drive device zones, and the connection section zones.

In the above, a light-transmitting layer is further included, wherein the light-transmitting layer is filled in the first heat dissipation layer, the light-transmitting layer having a first surface facing the function layer, the first heat dissipation layer having a second surface facing the function layer, the first surface being flush with the second surface.

In the above, the function layer further comprises an insulation layer, the insulation layer being arranged on one side of the drive devices and the metal wires that is distant from the carrier plate, the connection sections being arranged on the insulation layer at one side thereof that is distant from the metal lines, the openings extending through the insulation layer to allow the connection sections and the drive devices to connect to each other.

In the above, the first heat dissipation layer comprises an insulating substance.

This application provides a method for manufacturing an array substrate, which comprises:
  forming a first heat dissipation layer on a carrier plate;
  forming a plurality of drive devices and a plurality of metal wires on the first heat dissipation layer, wherein the metal wires are arranged between the drive devices;
  forming openings in the drive devices; and
  forming connection sections on the first heat dissipation layer, such that the connection sections each have an end extending through the openings to connect with one of the drive devices and another end extending across the metal wires to connect with an adjacent one of the drive devices.

In the above method, the first heat dissipation layer is formed through sputtering.

In the above method, the carrier plate is first sputtered with a base target, and the base target of the carrier plate is then subjected to plasma treatment or high temperature annealing in an oxygen atmosphere to form the first heat dissipation layer.

This application provides a display device, which comprises an array substrate. The array substrate comprises a carrier plate, a first heat dissipation layer, and a function layer arranged to stack in sequence on each other, the function layer being arranged on one side adapted to face a user, wherein the function layer comprises a plurality of drive devices and metal wires and connection sections arranged between the plurality of drive devices, the plurality of drive devices being formed therein with openings, the connection sections each having an end extending through the openings to connect to one of the drive devices and an opposite end extending across the metal wires to connect to an adjacent one of the drive devices, the first heat dissipation layer dissipating heat from the metal wires, the plurality of drive devices, and the connection sections through the carrier plate.

In the above device, the array substrate further comprises a second heat dissipation layer, wherein the second heat dissipation layer is stacked on the carrier plate and is located on one side of the carrier plate that is opposite to the function layer.

In the above device, the function layer comprises drive device zones, metal wire zones, and connection section zones, the drive device zones comprising the drive devices arranged therein, the metal wire zones comprising the metal wires arranged therein, the connection section zones comprising the connection sections arranged therein, the first heat dissipation layer having an orthogonal projection on the function layer that falls within the metal wire zones, the drive device zones, and the connection section zones In the above device, the array substrate further comprises a light-transmitting layer, wherein the light-transmitting layer is filled in the first heat dissipation layer, the light-transmitting layer having a first surface facing the function layer, the first heat dissipation layer having a second surface facing the function layer, the first surface being flush with the second surface.

In the above device, the function layer further comprises an insulation layer, the insulation layer being arranged on one side of the drive devices and the metal wires that is distant from the carrier plate, the connection sections being arranged on the insulation layer at one side thereof that is distant from the metal lines, the openings extending through the insulation layer to allow the connection sections and the drive devices to connect to each other.

In the above device, the first heat dissipation layer comprises an insulating substance.

Embodiments of this application provide an array substrate, which comprises a carrier plate, a first heat dissipation layer, and a function layer. The first heat dissipation layer is arranged exactly under the function layer. The first heat dissipation layer functions to uniformly dissipate heat generated in the operations of the drive devices, the metal wires, and the connection sections to the outside. The first heat dissipation layer is arranged at one side that is adjacent to the carrier plate for readily dissipating heat through the carrier plate to the outside of the array substrate so that air flowing outside the carrier plate may bring the heat to the outside of the display device to thereby enhance the heat dissipation efficiency and thus preventing the thermal issues in the array substrate from getting more server and also to improve the performance of the drive devices and, in addition, to alleviate the thermal issue at the connection at the sites of the openings between the metal wires and different-layer metal wires to prevent deteriorated connection of the metal wires and thus improving product yield.

BRIEF DESCRIPTION OF THE DRAWINGS

To more clearly explain the technical solution proposed in embodiments of this application, a brief description of the drawings that are necessary for describing the embodiments will be given below. It is obvious that the drawings that will be described below show only some embodiments of this application. For those having ordinary skills of the art, other drawings may be readily available from these attached drawings without the expense of creative effort and endeavor.

DETAILED DESCRIPTION OF THE PREFERRED EMBODIMENTS

A clear and complete description will be given to technical solutions provided in the embodiments of this application with reference to the attached drawings of the embodiments of this application.

Figure 1:
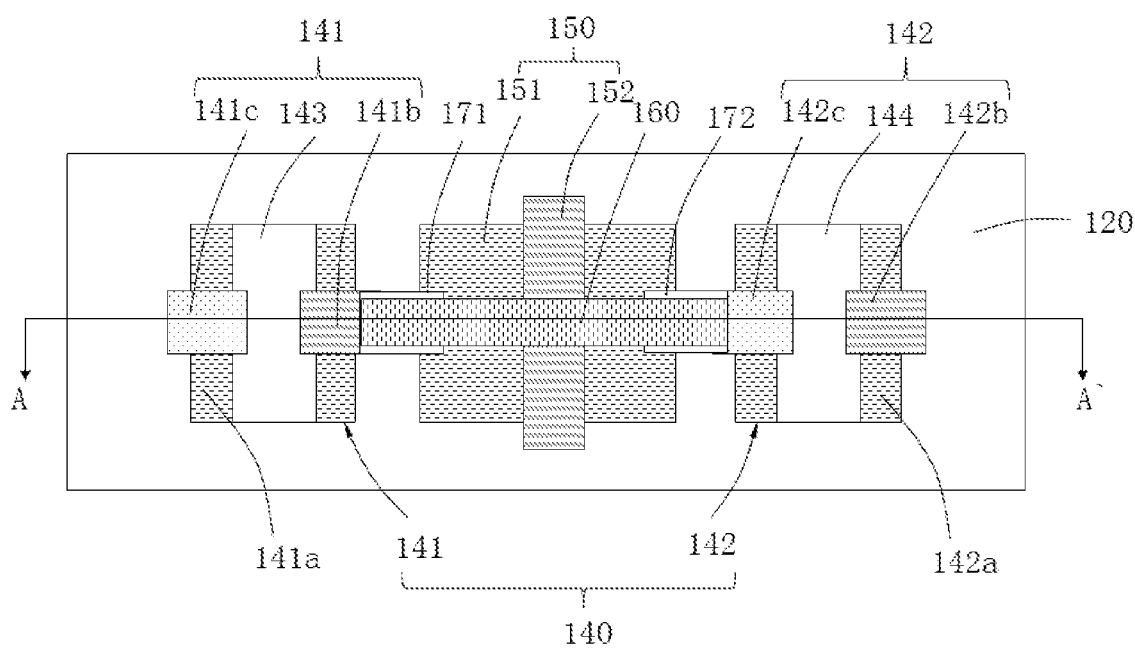
FIG. 1 is a schematic view illustrating a structure of an array substrate provided in a first embodiment of this application.
Figure 2:
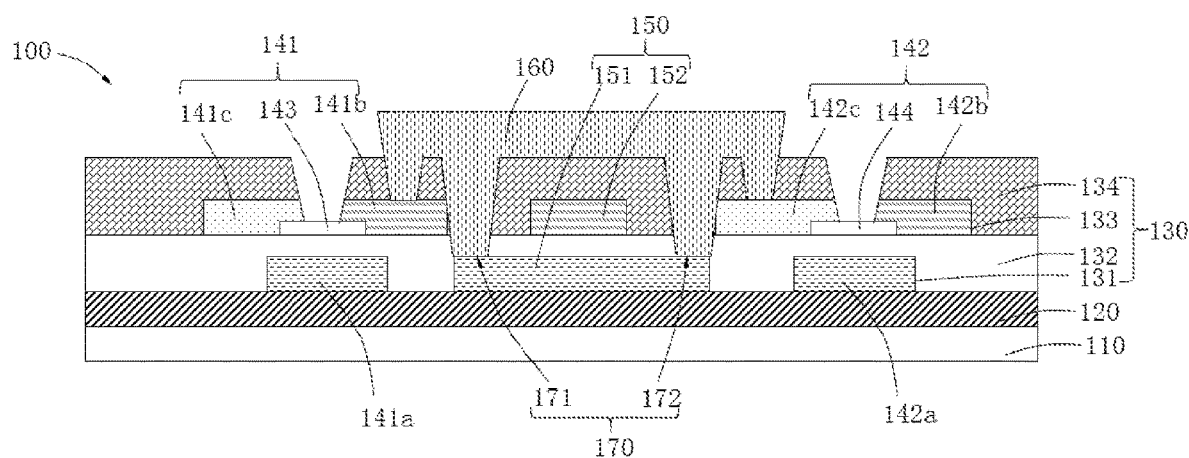
FIG. 2 is a cross-sectional view taken in direction AK of FIG. 1.

Referring to FIGS. 1 and 2, FIG. 1 shows an array substrate provided in a first embodiment of this application. FIG. 2 is a cross-sectional view taken in direction AK of FIG. 1. The array substrate 100 comprises a carrier plate 110, a first heat dissipation layer 120, and a function layer 130 that are arranged to stack, in sequence, on each other, wherein the function layer 130 is arranged on one side that faces a user. The function layer 130 comprises a plurality of drive devices 140 and metal wires 150 and connection sections 160 arranged between the plurality of drive devices 140. The plurality of drive devices 140 are provided therein with openings 170, and the connection sections 160 are each arranged to connect, at one end thereof, with one of the drive devices 140 by way of the openings 170 and to connect an adjacent one of the drive devices 140 with an opposite end thereof that extend across and over the metal wires 150. The first heat dissipation layer 120 conducts heat generated by the metal wires 150, the plurality of drive devices 140, and the connection sections 160 away for dissipating through the carrier plate 110.

Embodiments of this application provide the first heat dissipation layer 120 exactly under the function layer 130 with the first heat dissipation layer 120 being made of a material having excellent performance of heat dissipation so that heat generated during the operations of the drive devices 140, the metal wires 150 and the connection sections 160 can be uniformly conducted away. The first heat dissipation layer 120 is arranged on one side of the carrier plate 110 in order to have the heat conducted through the carrier plate 110 to the outside of the array substrate 100 so that air flowing outside the carrier plate 110 may bring the heat to the outside of a display device to thereby enhance the heat dissipation efficiency and thus preventing the thermal issues in the array substrate 100 from getting more server and also to improve the performance of the drive devices 140 and, in addition, to alleviate the thermal issue at the connection at the sites of the openings 170 between the metal wires 150 and different-layer metal wires 150 to prevent deteriorated connection of the metal wires 150 and thus improving product yield.

In the instant embodiment, the drive devices 140 comprise thin-film transistors, each of which comprises a gate electrode, a source electrode, and a drain electrode. The metal wires 150 can be scan signal lines or data lines. The connection sections 160 are each connected between adjacent ones of the drive devices 140 and are metal lines that are on a different layer from the metal wires 150.

Specifically, an area of the array substrate 100 that comprises two thin-film transistors will be taken as an example for illustration, wherein the two thin-film transistors are respectively designated as a first thin-film transistor 141 and a second thin-film transistor 142 and the first thin-film transistor 141 and the second thin-film transistor 142 are respectively arranged on two sides of one of the metal wires 150. The function layer 130 comprises a first layer 131 and the second layer 133 that are arranged to stack on each other. The first layer 131 is adjacent to the first heat dissipation layer 120. The first layer 131 comprises the gate electrode 141a of the first thin-film transistor 141, a lower-layer metal wire 152, and the gate electrode 141a of the second thin-film transistor 142, which are arranged to space from each other. The first layer 131 is provided thereon with a first insulation layer 132 that covers the first layer 131. Preferably, the first insulation layer 132 comprises a heat dissipating substance. The second layer 133 is provided on the first insulation layer 132. The second layer 133 comprises the source electrode 141b, the drain electrode 141c, and a semiconductor layer 143 of the first thin-film transistor 141, an upper-layer metal wire 151, and the source electrode 142b, the drain electrode 142c, and a semiconductor layer 144 of the second thin-film transistor 142, wherein the source electrode 141 of the first thin-film transistor 141 and the drain electrode 142c of the second thin-film transistor 142 are arranged opposite to each other. Extension directions of the upper-layer metal wire 151 and the lower-layer metal wire 152 are identical. Preferably, the upper-layer metal wire 151 has an orthogonal projection on the carrier plate 110 that is located in an area of the lower-layer metal wire 152. The lower-layer metal wire 152 can be a can line, while the upper-layer metal wire 151 is a data line.

The function layer 130 may further comprise a second insulation layer 134. The second insulation layer 134 is arranged on one side of the drive devices 140 and the metal wire 150 that is distant from the carrier plate 110. The connection section 160 is arranged on the second insulation layer 134 on one side thereof that is opposite to the metal wire 150. The openings 170 extend through the second insulation layer 134 to allow the connection section 160 to connect to the drive devices 140. Preferably, the second insulation layer 134 may comprise a heat dissipating substance. Specifically, the second insulation layer 134 is formed with a first opening 171 and a second opening 172. The connection sections 160 is arranged on the second insulation layer 134 such that two ends of the connection sections 160 are respectively extended into the first opening 171 and the second opening 172 to connect to the source electrode 141b of thin-film transistor 141 and the drain electrode 142c of the second thin-film transistor 142. An extension direction of the connection sections 160 intersects the extension directions of the and the lower-layer metal wire 152 and the upper-layer metal wire 151. Preferably, the extension direction of the connection sections 160 is perpendicular to the extension directions of the lower-layer metal wire 152 and the upper-layer metal wire 151.

In the instant embodiment, the first heat dissipation layer 120 is laid on the entire carrier plate 110, and the first heat dissipation layer 120 has a surface that is on the side facing the drive device 140 is flat and smooth so that the first heat dissipation layer 120 provides not only an effect of heat dissipation but also an effect of planarization. In other words, the first heat dissipation layer 120 functions for both planarization and heat dissipation. The first heat dissipation layer 120 can be a light-transmitting layer, allowing for transmission of light from a backlight source. It can be appreciated that the first heat dissipation layer 120 comprises an insulating substance in order to prevent shorting between the drive devices 140 and between the drive devices 140 and the lower-layer metal wire 152 that might affect the performance of the drive devices 140.

In an embodiment, the first heat dissipation layer 120 is formed of a material comprises a metal oxide, a nitride, or a carbide. The metal oxide can be selected as one of beryllium oxide (BeO), magnesium oxide (MgO), aluminum oxide ($Al_2O_3$), calcium oxide (CaO), and nickel oxide (NiO) or a combination thereof. The nitride can be selected as one of aluminum nitride (AlN) and boron nitride (BN) or a combination thereof. The carbide can be selected as one of silicon carbide (SiC) and boron carbide ($B_4C_3$) or a combination thereof. The selection of the material of the first heat dissipation layer 120 is made according to practical needs and no specific limitation is provided herein. The first heat dissipation layer 120 may also comprise heat-dissipating implants or dopants in the form of linear nanometer objects or nanometer particulates to make further homogeneous heat dissipation thereby further improve the heat dissipation efficiency of the heat dissipation layer.

Figure 3:
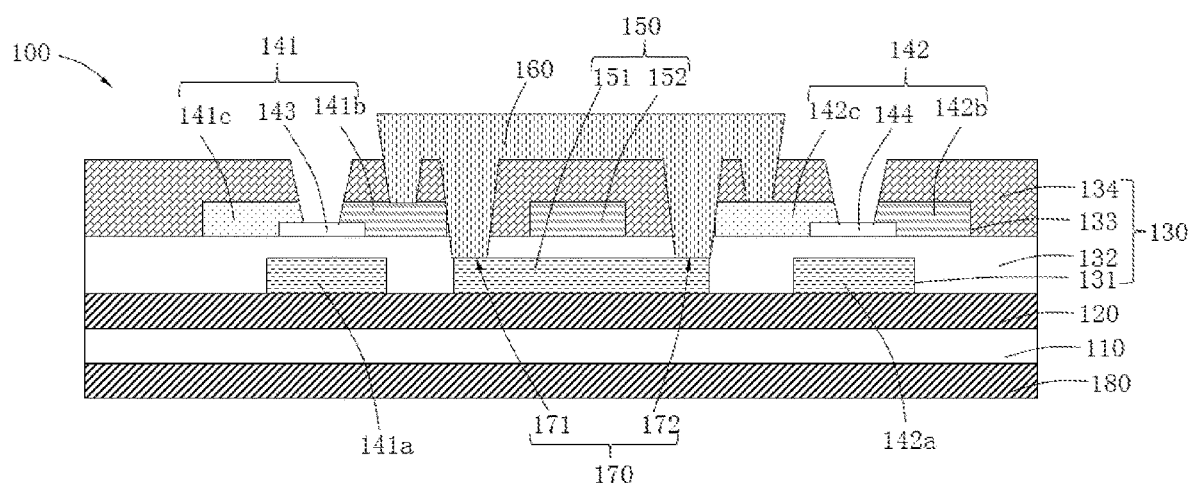
FIG. 3 is a schematic view illustrating a structure of an array substrate provided in a second embodiment of this application.

Referring to FIG. 3, FIG. 3 shows an array substrate 100 provided in a second embodiment of this application. On the basis of the first embodiment, the array substrate 100 further comprises a second heat dissipation layer 180. The second heat dissipation layer 180 is stacked on the carrier plate 110 and is located on one side of the carrier plate 110 that is opposite to the function layer 130. The second heat dissipation layer 180 is arranged on an outer side of the carrier plate 110 and in direct contact with air, so that the second heat dissipation layer 180 provides a heat dissipation efficiency that is higher than the first heat dissipation layer 120. Thus, the second heat dissipation layer 180 may further improve the heat dissipation efficiency of the array substrate 100.

Figure 4:
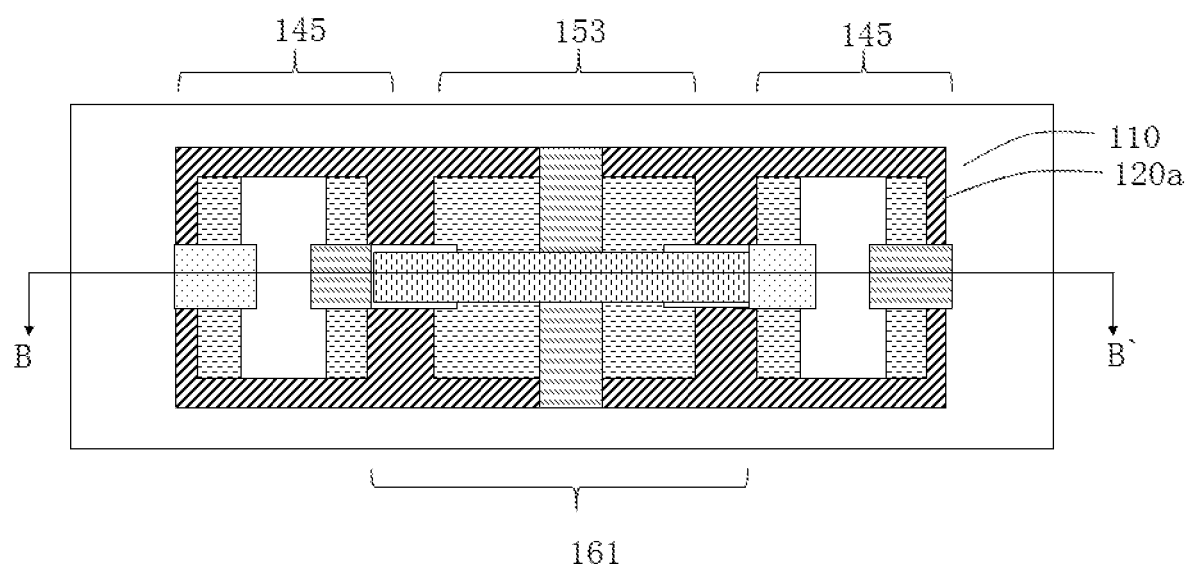
FIG. 4 is a schematic view illustrating a structure of an array substrate provided in a third embodiment of this application.
Figure 5:
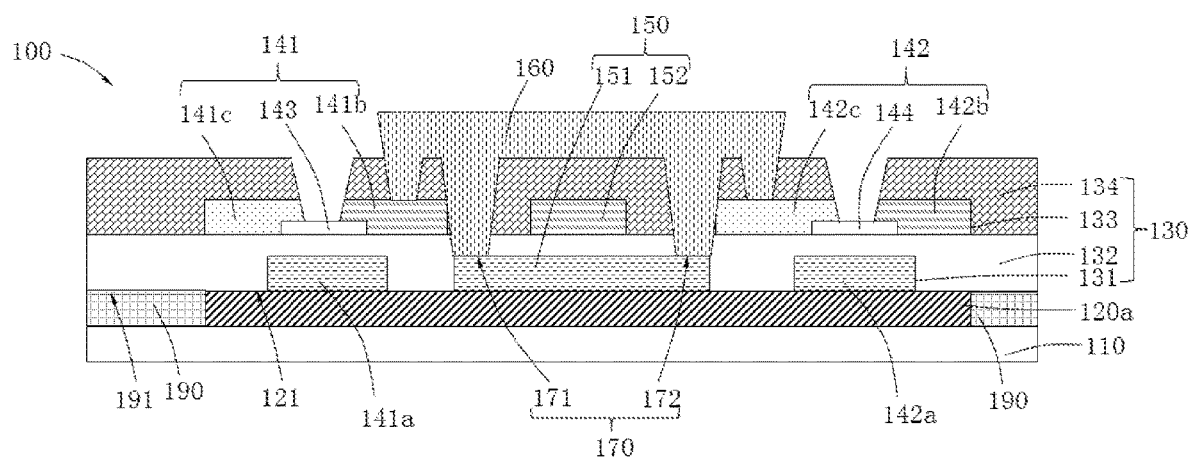
FIG. 5 is a cross-sectional view taken in direction BB' of FIG. 4.

Referring to FIGS. 4 and 5, FIG. 4 shows an array substrate 100 provided in a third embodiment of this application. FIG. 5 is a cross-sectional view taken in direction BB' of FIG. 4. The function layer 130 comprises drive device zones 145, a metal wire zone 153, and a connection section zone 161. The drive device zones 145 comprise drive devices 140 arranged therein; the metal wire zone 153 comprises a metal wire 150 arranged therein; and the connection section zone 161 comprises a connection section 160 arranged therein. The first heat dissipation layer 120 has an orthogonal project on the function layer 130 that fall within the metal wire zone 153, the drive device zone 145 and the connection section zone 161. Such an arrangement is made for patterning of the first heat dissipation layer 120a and such as first heat dissipation layer 120a is located under the metal wire 150, the connection section 160, and the drive devices 140 so as to prevent interference with signal transmission made in other components or devices provided on the array substrate 100 and is made of a material having an excellent heat dissipating property so that heat generated in the array substrate 100 can be uniformly and completely dissipated to the outside of the array substrate 100 to achieve excellent heat dissipation performance and not causing an excessively high temperature in the array substrate 100.

In the instant embodiment, referring to FIG. 5, the array substrate 100 may further comprise a light-transmitting layer 190. The light-transmitting layer 190 is arranged to fill in voids of the patterned first heat dissipation layer 120. The light-transmitting layer 190 allows for transmission of light from a backlight source. The light-transmitting layer 190 comprises a first surface 191 that faces the function layer 130 and the first heat dissipation layer 120 comprises a second surface 121 that faces the function layer 130. The first surface 191 and the second surface 121 are flush with each other so that the patterned first heat dissipation layer 120 is made planar to allow for disposition of the first heat dissipation layer 120 on the function layer 130.

Figure 6:
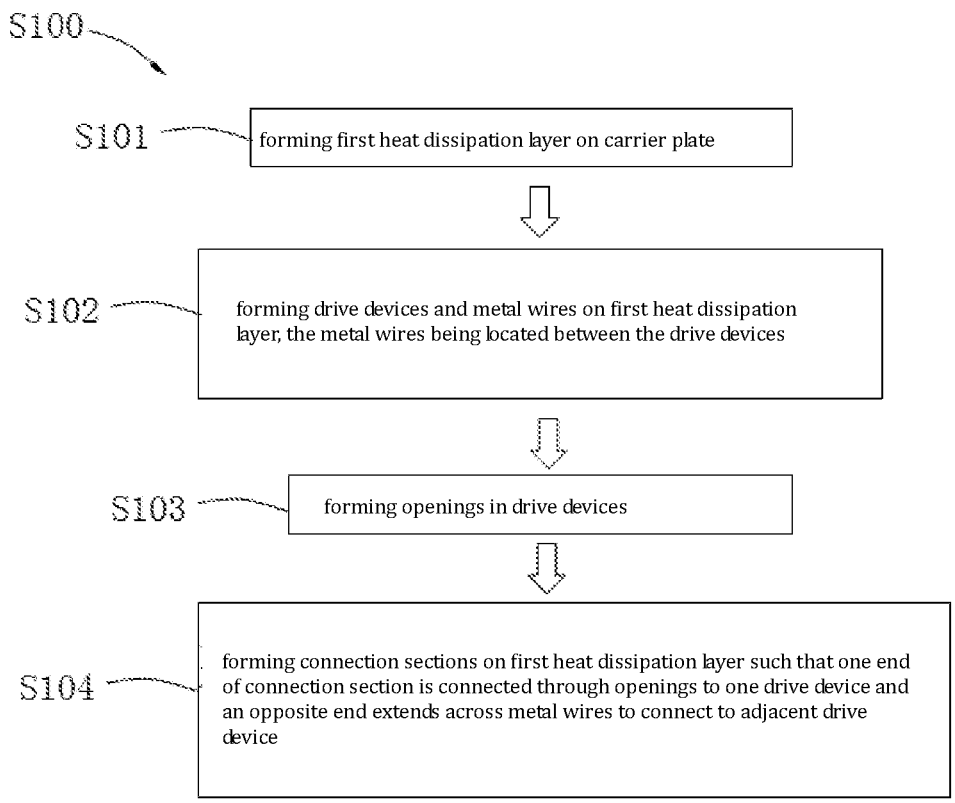
FIG. 6 is a flow chart illustrating a manufacturing method of an array substrate provided in embodiments of this application.

Referring to FIG. 6, embodiments of this application also provide a manufacturing method S100 of the array substrate 100, which comprises:

S101, forming a first heat dissipation layer 120 on a carrier plate 110. Specifically, in an embodiment, the first heat dissipation layer 120 is formed in a way of sputtering a raw material of the first heat dissipation layer 120 on the carrier plate 110. Specifically, when the first heat dissipation layer 120 comprises aluminum oxide, the raw material used is an aluminum oxide target. In another embodiment, a base target is first sputtered on the carrier plate 110 and then, the base target provided on the carrier plate 110 is subjected to plasma treatment or high temperature annealing in an oxygen atmosphere in order to form the first heat dissipation layer 120. Specifically, when the first heat dissipation layer 120 comprises aluminum oxide, the base target is an aluminum target and is made or converted into a ceramic to form a conductive ceramic material having excellent heat conduction property.

S102, forming a plurality of drive devices 140 and a plurality of metal wires 150 on the first heat dissipation layer 120, wherein the metal wires 150 are arranged between the drive devices 140. Specifically, in the instant embodiment, the drive devices 140 comprise thin-film transistors, and a layer of conductive metals, such as Mo/AL/M, is deposited on the first heat dissipation layer 120 and is subjected to operations of exposure and development to form metal lines of a first layer 131, such as gate electrodes 141a of the thin-film transistor, and lower-layer metal wires 150. Then, a first insulation layer 132, such as SiNx, is deposited. A semiconductor layer, such as amorphous silicon, a-Si, is deposited on the first insulation layer 132 and is subjected to operations of exposure and development to form a patterned semiconductor layer. A metal layer, such as Mo/AL/Mo, is then deposited on the first insulation layer 132 and is subjected to operations of exposure and development to form metal lines of a second layer 133 (such as source electrodes and the drain electrode of the thin-film transistors) and upper-layer metal wires 150.

S103, forming openings 170 in the drive devices 140. A second insulation layer 134, such as SiN, is then deposited on the source electrodes and the drain electrodes of the thin-film transistors and the upper-layer metal wires 150 to serve as a passivation layer, which is subjected to operations of exposure and development to form a first opening 171 and a second opening 172 that bridge between a pixel display area and the metal lines.

S104, forming the connection sections 160 on the first heat dissipation layer 120, such that the connection sections 160 each have an end that is connected through the openings 170 to one of the drive devices 140 and an opposite end that extends across the metal wires 150 to connect to an adjacent one of the drive devices 140. A transparent conductive layer is deposited on the drive devices 140 and is subjected to operations of exposure and development to form the connection section 160 that bridges between the first opening 171 and the second opening 172.

Embodiments of this application also provide a display device, which comprises an array substrate 100 of any of the embodiments described above. The display device can be any product or device that has a display function, such as a mobile phone, a television, a display device, a notebook computer, a digital picture frame, and a navigation device.

In an embodiment, the display device comprises an organic light-emitting diode (OLED), and further comprises other structures including a glass cover plate, a polarization layer, anode layer, and an organic light emissive layer arranged on the array substrate 100 and a cathode arranged under the array substrate 100. Such structures can be formed in a variety of ways and no specific limitation is provided herein. In other embodiments, the display device can be a liquid crystal display (LCD) and further comprises other structures, including a cover plate, an upper polarizer, a color filter layer, and a liquid crystal layer arranged on the array substrate 100 and also comprises other structures including a lower polarizer and a backlight layer arranged under the array substrate 100. Such structures can be formed in a variety of ways and no specific limitation is provided herein.

The embodiments of this application provide a display device, which comprises the above-described array substrate 100, which comprises a first heat dissipation layer 120 arranged exactly under the function layer 130 to uniformly dissipate heat generated in the operations of the drive devices 140, the metal wires 150, and the connection sections 160 to the outside. The first heat dissipation layer 120 is arranged on one side of the carrier plate 110 for readily dissipating heat through the carrier plate 110 to the outside of the array substrate 100 so that air flowing outside the carrier plate 110 may bring the heat to the outside of the display device to thereby enhance the heat dissipation efficiency and thus preventing the thermal issues in the array substrate 100 from getting more server and also to improve the performance of the drive devices 140 and, in addition, to alleviate the thermal issue at the connection at the sites of the openings 170 between the metal wires 150 and different-layer metal wires 150 to prevent deteriorated connection of the metal wires 150 and thus improving product yield. The embodiment of this application provide a manufacturing method of the array substrate 100, which allows for timely dissipation of heat from metal wires 150 having a large current and large joule heating, openings, and electronic devices so as not to cause local high temperatures of the metal wires, the openings, and the electronic devices, leading to failure deterioration of conduction property thereof.

In summary, although the above disclosure provides the preferred embodiments of this application, the preferred embodiments are not intended to limit this application. For those having ordinary skills in the art, various changes and modifications are available without departing from the sprit and scope of this application. Thus, the scope of protection of this application is only determined by the appended claims.

What is claimed is:

1. An array substrate, comprising a carrier plate, a first heat dissipation layer, and a function layer arranged to stack in sequence on each other, the function layer being arranged on one side adapted to face a user, wherein the function layer comprises a plurality of drive devices and metal wires and connection sections arranged between the plurality of drive devices, the plurality of drive devices being formed therein with openings, the connection sections each having an end extending through the openings to connect to one of the drive devices and an opposite end extending across the metal wires to connect to an adjacent one of the drive devices, the first heat dissipation layer dissipating heat from the metal wires, the plurality of drive devices, and the connection sections through the carrier plate;

wherein a second heat dissipation layer is stacked on the carrier plate and is located on one side of the carrier plate that is opposite to the function layer.

2. The array substrate according to claim 1, wherein the function layer comprises drive device zones, metal wire zones, and connection section zones, the drive device zones comprising the drive devices arranged therein, the metal wire zones comprising the metal wires arranged therein, the connection section zones comprising the connection sections arranged therein, the first heat dissipation layer having an orthogonal projection on the function layer that falls within the metal wire zones, the drive device zones, and the connection section zones.

3. The array substrate according to claim 2 further comprising a light-transmitting layer, wherein the light-transmitting layer is filled in the first heat dissipation layer, the light-transmitting layer having a first surface facing the function layer, the first heat dissipation layer having a second surface facing the function layer, the first surface being flush with the second surface.

4. The array substrate according to claim 1, wherein the function layer further comprises an insulation layer, the insulation layer being arranged on one side of the drive devices and the metal wires that is distant from the carrier plate, the connection sections being arranged on the insulation layer at one side thereof that is distant from the metal lines, the openings extending through the insulation layer to allow the connection sections and the drive devices to connect to each other.

5. The array substrate according to claim 1, wherein the first heat dissipation layer comprises an insulating substance.

6. A method for manufacturing an array substrate, comprising:
    forming a first heat dissipation layer on a carrier plate;
    forming a plurality of drive devices and a plurality of metal wires on the first heat dissipation layer, wherein the metal wires are arranged between the drive devices;
    forming openings in the drive devices; and
    forming connection sections on the first heat dissipation layer, such that the connection sections each have an end extending through the openings to connect with one of the drive devices and another end extending across the metal wires to connect with an adjacent one of the drive devices;
    wherein the carrier plate is sputtered with a base target, and the base target of the carrier plate is subjected to plasma treatment or high temperature annealing in an oxygen atmosphere to form the first heat dissipation layer.

7. The method for manufacturing an array substrate according to claim 6, wherein the first heat dissipation layer is formed through sputtering.

8. A display device, comprising an array substrate, the array substrate comprising a carrier plate, a first heat dissipation layer, and a function layer arranged to stack in sequence on each other, the function layer being arranged on one side adapted to face a user, wherein the function layer comprises a plurality of drive devices and metal wires and connection sections arranged between the plurality of drive devices, the plurality of drive devices being formed therein with openings, the connection sections each having an end extending through the openings to connect to one of the drive devices and an opposite end extending across the metal wires to connect to an adjacent one of the drive devices, the first heat dissipation layer dissipating heat from the metal wires, the plurality of drive devices, and the connection sections through the carrier plate;
    wherein the function layer comprises drive device zones, metal wire zones, and connection section zones, the drive device zones comprising the drive devices arranged therein, the metal wire zones comprising the metal wires arranged therein, the connection section zones comprising the connection sections arranged therein, the first heat dissipation layer having an orthogonal projection on the function layer that falls within the metal wire zones, the drive device zones, and the connection section zones; and
    wherein the array substrate further comprises a light-transmitting layer, wherein the light-transmitting layer is filled in the first heat dissipation layer, the light-transmitting layer having a first surface facing the function layer, the first heat dissipation layer having a second surface facing the function layer, the first surface being flush with the second surface.

9. The display device according to claim 8, wherein the array substrate further comprises a second heat dissipation layer, wherein the second heat dissipation layer is stacked on the carrier plate and is located on one side of the carrier plate that is opposite to the function layer.

10. The display device according to claim 8, wherein the function layer further comprises an insulation layer, the insulation layer being arranged on one side of the drive devices and the metal wires that is distant from the carrier plate, the connection sections being arranged on the insulation layer at one side thereof that is distant from the metal lines, the openings extending through the insulation layer to allow the connection sections and the drive devices to connect to each other.

11. The display device according to claim 8, wherein the first heat dissipation layer comprises an insulating substance.

* * * * *